(12) United States Patent
Linliu

(10) Patent No.: US 6,348,707 B1
(45) Date of Patent: Feb. 19, 2002

(54) METHOD OF MANUFACTURING SEMICONDUCTOR CAPACITOR

(75) Inventor: Kung Linliu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/675,971

(22) Filed: Sep. 29, 2000

(51) Int. Cl.[7] .............................................. H01L 29/72
(52) U.S. Cl. ....................... 257/296; 257/309; 257/310; 257/532; 438/244; 438/255
(58) Field of Search ................................ 257/296, 309, 257/310, 532; 438/255, 244

(56) References Cited

PUBLICATIONS

"Ordered Bicontinuous Nanoporous and Nanorelief Ceramic Films from Self Assembling Polymer Precursers", Science, vol. 286, pp. 1716–1719, Nov. 26, 1999.*

Chan et al., *Ordered Bicontinuous Nanoporous and Nanorelief Ceramic Films from Self Assembling Polymer Precursors*, Science, vol. 286, Nov. 26, 1999, pp. 1716–1719.

* cited by examiner

Primary Examiner—Edward Wojciechowicz
(74) Attorney, Agent, or Firm—J.C. Patents

(57) ABSTRACT

A method of manufacturing dynamic random access memory (DRAM) capacitor. A semiconductor substrate having an insulation layer thereon is supplied. A triblock copolymer layer is formed over the insulation layer by performing a spin-coating process. The triblock copolymer layer is patterned and then the triblock copolymer layer is annealed at a low temperature. The annealed triblock copolymer is exposed to ultraviolet rays in an atmosphere containing ozone so that the triblock copolymer is converted into a lower electrode layer having a bicontinuous three-dimensional nanoporous structure. A dielectric layer is formed over the lower electrode. An upper electrode is formed over the dielectric layer. The upper electrode, the dielectric layer and the lower electrode are sequentially patterned to form the DRAM capacitor. The lower electrode made from bicontinuous ceramic material is able to allow for greater surface area and hence is suitable for forming the capacitors in a DRAM unit with storage capacity of 64 MB or more.

19 Claims, 4 Drawing Sheets

METHOD OF MANUFACTURING SEMICONDUCTOR CAPACITOR

BACKGROUND OF THE INVENTION

1. Field of Invention

The present invention relates to a method of manufacturing a semiconductor capacitor. More particularly, the present invention relates to a method of manufacturing a dynamic random access memory (DRAM) capacitor.

2. Description of Related Art

In general, each integrated circuit memory unit has a capacitor. The charge level of the capacitor is used to represent a bit of data in the memory. For example, a dynamic random access memory (DRAM) normally consists of an array of memory cells with each memory cell having a charge storage capacitor connected to the source/drain terminal of a pass field effect transistor (FET). The electrode of the capacitor provides one or two different charge levels to represent a logic signal '1' or '0' in the memory cell.

Therefore, the capacitor is often regarded as the principle element for storing signals in a DRAM cell. In general, the higher the storage capacity of a capacitor, the greater the signal storage capacity of the capacitor will be and the lesser the effect of noise will be when data are read out from the capacitor. For example, if the capacitor has a high capacitance, soft errors generated through bombardment of α-particles are greatly reduced.

A DRAM charge storage capacitor consists of a lower electrode, an insulating dielectric layer and an upper electrode. Typically, the electrodes are doped polysilicon layers and the lower electrode of the charge storage capacitor is in contact with the source/drain terminal of a pass FET to form a polysilicon structure having a lower surface. A portion of the lower electrode may extend into an insulation layer. This insulation layer is formed over other portions of the pass FET and a portion of the region close to the DRAM. Although the lower electrode of the capacitor can have a planar surface, a complicated surface profile is usually formed.

To increase the storage capacity of a capacitor, dielectric material is deposited carefully to form a quality dielectric layer in addition to using a dielectric layer having a high dielectric constant. A further increase in storage capacity is achieved by increasing the surface area of the capacitor electrodes. In an era of device miniaturization, the way to maintain a sufficiently large surface area in each capacitor despite the provision of ever-shrinking substrate area is still an important topic of investigation for semiconductor manufacturers.

FIG. 1 is a schematic cross-sectional view showing a conventional stacked type DRAM capacitor structure. As shown in FIG. 1, a semiconductor substrate 100 having a metal-oxide-semiconductor (MOS) transistor 102 thereon is provided. The MOS transistor 102 includes a gate 104 and a pair of source/drain terminals 106. A field oxide layer 107 and a conductive layer 108 are sequentially formed over the semiconductor substrate 100. An insulation layer 110 is formed over the substrate 100. The insulation layer 110 is etched to form a contact opening at a designated location above one of the source/drain terminals 106. A lower electrode 120, a dielectric layer 130 and an upper electrode 140 are sequentially formed over the contact opening, thereby forming a stacked capacitor structure 150. The dielectric layer 130 can be a nitride/oxide (NO) composite layer or an oxide/nitride/oxide (ONO) composite layer. The lower electrode 120 and the upper electrode 140 can be polysilicon layers. The lower electrode 120 can have an undulating cross-sectional profile to increase surface area of the capacitor 150. Finally, a metal contact 106 and a passivation layer (not shown in the figure) are formed over the substrate 100 to form a complete DRAM structure.

The aforementioned stacked capacitor is frequently employed to form DRAM units. Although surface morphology of a capacitor is improved by producing various types of undulating profiles, the increase in capacitance is insufficient to compensate for a reduction of size due to miniaturization.

Other methods of increasing the surface area of a capacitor are also developed, including the production of an uneven surface structure such as a crown, a cylinder, a fin, a branch or a cavity. Sometimes, hemispherical silicon grains (HSG) are even grown over these surface structures. However, these structures are formed by undergoing a series of complicated steps, thereby increasing manufacturing difficulties and cost of production.

SUMMARY OF THE INVENTION

Accordingly, one object of the present invention is to provide an easier method of manufacturing a high-storage-capacity semiconductor capacitor.

To achieve these and other advantages and in accordance with the purpose of the invention, as embodied and broadly described herein, the invention provides a method of manufacturing a dynamic random access memory (DRAM) capacitor. A semiconductor substrate having a metal-oxide-semiconductor (MOS) transistor thereon is provided. An insulation layer is formed over the semiconductor substrate. A triblock copolymer layer is formed over the insulation layer by performing a spin-coating process. The triblock copolymer layer is patterned and then the triblock copolymer layer is annealed at a low temperature. The annealed triblock copolymer is exposed to ultraviolet rays in an atmosphere containing ozone so that the triblock copolymer is converted into a bicontinuous three-dimensional nanoporous material. The triblock copolymer layer serves as the lower electrode of a capacitor. A dielectric layer is formed over the lower electrode. An upper electrode is formed over the dielectric layer. The upper electrode, the dielectric layer and the lower electrode are sequentially patterned to form the DRAM capacitor.

This invention also provides a lower electrode structure that uses a bicontinuous three-dimensional nanoporous material. The material not only has a high degree of internal regularity, but also has a high degree of convolution. Moreover, the porosity and degree of complexity of the structure is difficult to reproduce by a conventional photolithographic process. Since porous material can increase surface area, a lower electrode made from the bicontinuous three-dimensional nanoporous material has a greater overall surface area than an electrode made from conventional material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
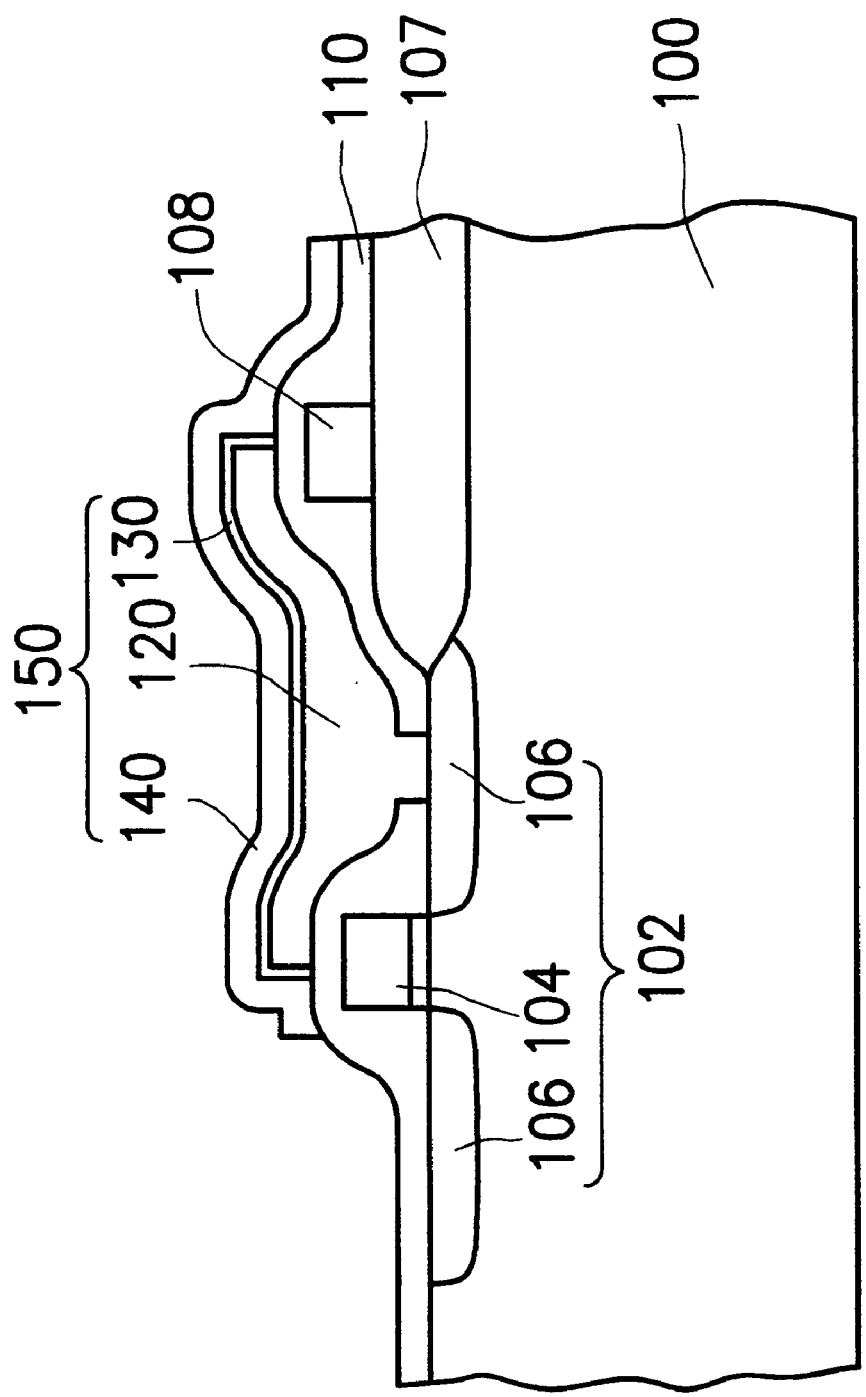
FIG. 1 is a schematic cross-sectional view showing a conventional stacked type DRAM capacitor structure.

Reference will now be made in detail to the present preferred embodiments of the invention, examples of which are illustrated in the accompanying drawings. Wherever possible, the same reference numbers are used in the drawings and the description to refer to the same or like parts.

To increase the surface area of a charge storage electrode in an ever-shrinking DRAM substrate surface, a bicontinuous material is used to form the lower electrode. In this embodiment, one type of bicontinuous material is used. However, the type of bicontinuous material is not limited to the one chosen in the illustration.

Figure 2:
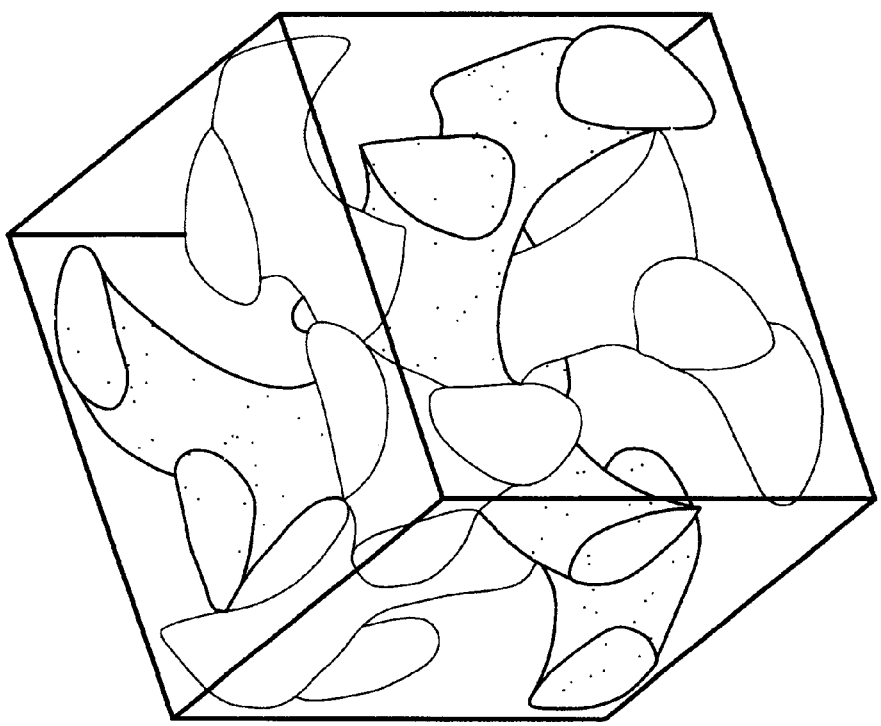
FIG. 2 shows the internal structure of a block of triblock copolymer material used in one preferred embodiment of this invention.

In the preferred embodiment of this invention, a bicontinuous three-dimensional nanoporous ceramic substance is used to form the lower electrode of a capacitor. The ceramic substance is produced using triblock copolymer as a starting material. A triblock copolymer is a three-part molecule $A_1BA_2$, where A represents poly(isoprene) (PI for short) and B represents poly(pentamethyldisilylstyrene) (P(PMDSS) for short). Molecular weight ratio between each group inside the triblock copolymer $A_1BA_2$ is 24/100/26. P(PMDSS) is the base material of the triblock copolymer $A_1BA_2$. Intertwined PI double gyroid morphology is formed on the P(PMDSS) base material. The volume fraction of PI in the base material is about 33%, for example. FIG. 2 shows the internal structure of a block of triblock copolymer material $A_1BA_2$ used in one preferred embodiment of this invention. Chemical formula of the copolymer is simplified to [P(PMDSS)-DG]. A low-temperature annealing of the [P(PMDSS)-DG] copolymer is carried out so that hydrocarbon PI base units are removed by oxidation and the silicon-contained P(PMDSS) basic unit is converted into silicon-oxide-carbon ceramic material. Consequently, the PI double gyroid morphology formed within the P(PMDSS) base material is removed. The space formerly occupied by the double gyroid structure in the P(PMDSS) base material will cause material distortion resulting in the formation of a continuous three-dimensional nanoporous structure. Meanwhile, the P(PMDSS) base material is converted into silicon-oxide-carbon ceramic material. Hence, a layer of bicontinuous interlaced three-dimensional nanoporous ceramic material is formed. Chemistry and the reacting mechanism related to the formation of bicontinuous material is disclosed in Science, Vol. 286, pgs. 1716–9.

The bicontinuous ceramic material not only has a high degree of internal regularity, but also has a highly complicated three-dimensional nanoporous structure. Porosity and complexity of the structure is difficult to reproduce by a conventional photolithographic process. Since pores within the bicontinuous ceramic material increase overall surface area, a lower electrode made from the bicontinuous ceramic material has a greater surface area than an electrode made from conventional material. Hence, the material can be used to form the small dimensional devices in a DRAM package capable of storing 64MB or more.

FIGS. 3A through 3D are schematic cross-sectional views showing the progression of steps for producing a DRAM stacked capacitor structure according to one preferred embodiment of this invention.

Figure 3A:
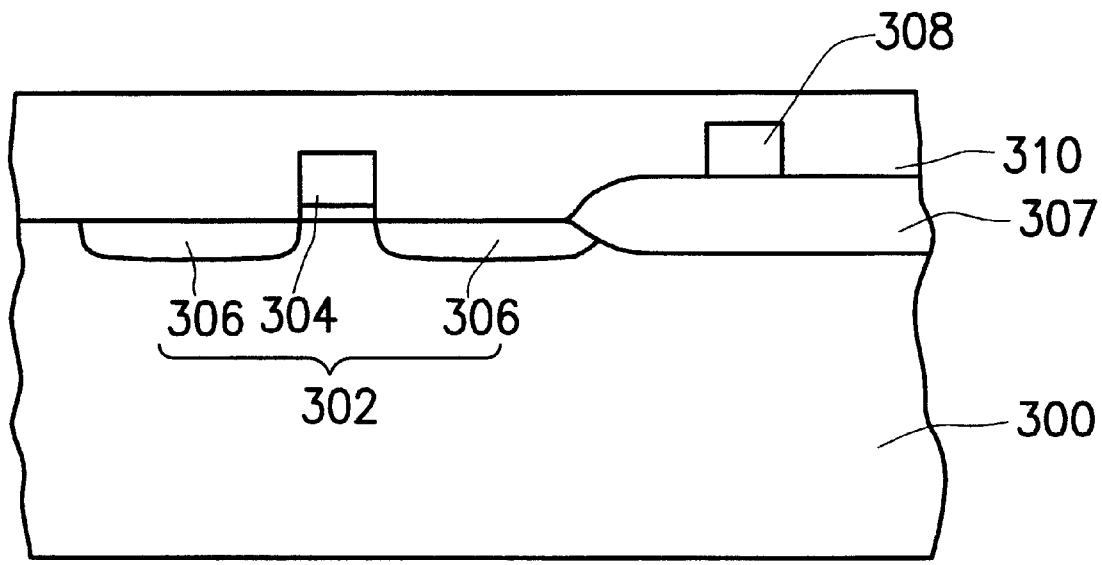
FIGS. 3A through 3D are schematic cross-sectional views showing the progression of steps for producing a DRAM stacked capacitor structure according to one preferred embodiment of this invention.

As shown in FIG. 3A, a semiconductor substrate 300 having a metal-oxide-semiconductor (MOS) transistor 302 thereon is provided. The MOS transistor 302 includes a gate 304 and a pair of source/drain terminals in the substrate 300. A field oxide layer 307 and a conductive layer 308 are formed over the semiconductor substrate 300. An insulation layer 310 such as a silicon dioxide layer is formed over the substrate 300 using tetra-ethyl-ortho-silicate (TEOS) as a gaseous reactant. The insulation layer 310 preferably has a thickness between about 3000 Å to 6000 Å.

Figure 3B:
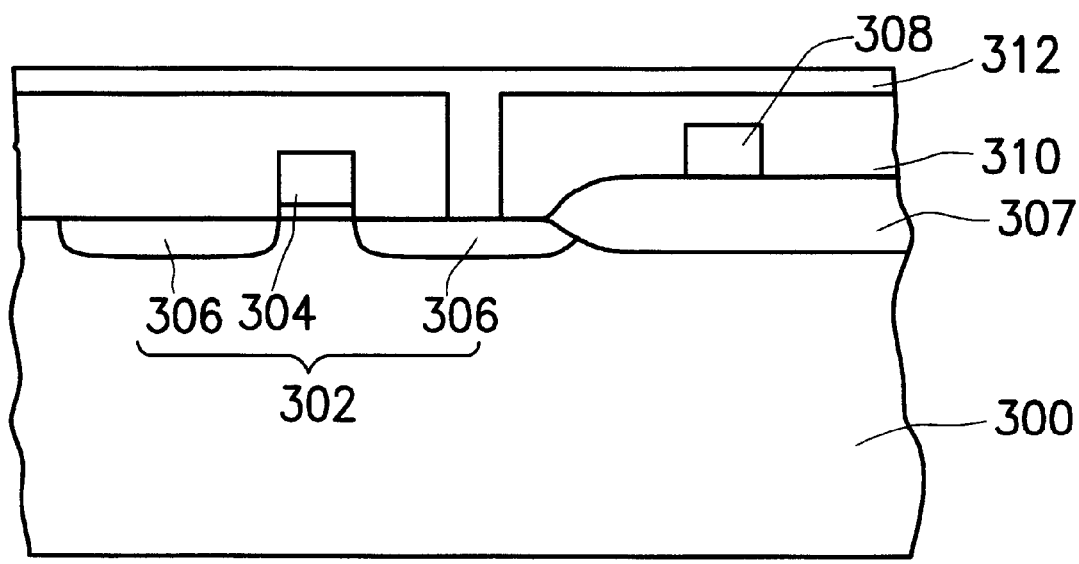

As shown in FIG. 3B, the insulation layer 310 is etched to form a contact opening above a designated source/drain region 306. A triblock copolymer [P(PMDSS)-DG] material is deposited over the insulation layer 310 and into the contact opening to form a triblock copolymer layer by conducting a spin-coating operation. The spin-coating process is preferably carried out by spraying [P(PMDSS)-DG] solution over the substrate at a rotational speed of 4000 rpm. The [P(PMDSS)-DG] solution contains 4~6% by weight of [P(PMDSS)-DG] in a solvent toluene.

Figure 3C:
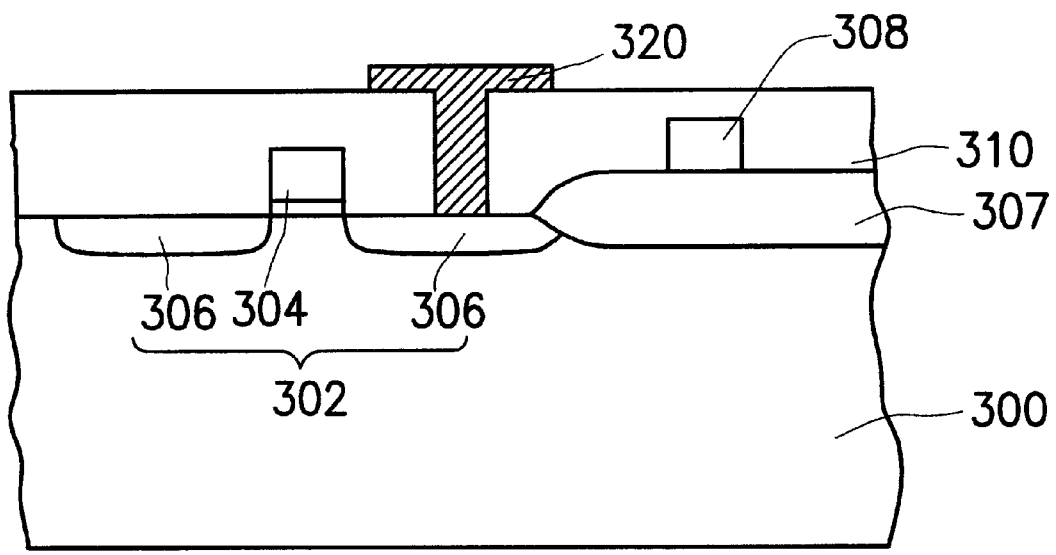

As shown in FIG. 3C, the triblock copolymer [P(PMDSS)-DG] layer 312 is patterned and then annealed at a low temperature for two days. The annealing temperature is between 100° C. to 150° C., preferably at 120° C. The annealed triblock copolymer layer 312 is exposed to ultraviolet rays in an atmosphere containing 2% ozone for at least an hour so that PI within the [P(PMDSS)-DG] layer 312 is removed. The silicon within the P(PMDSS) is converted into a silicon-oxide-carbon compound. After the reaction, the [P(PMDSS)-DG] layer 312 is transformed into a bicontinuous interlaced three-dimensional nanoporous ceramic layer, in other words, a lower electrode layer 320. The lower electrode 320 has a thickness between about 2000 Å to 5000 Å.

When the [P(PMDSS)-DG] layer 312 is subjected to ultraviolet rays and ozone, the PI double gyroid morphology within the [P(PMDSS)-DG] layer 312 is removed. The leftover space within the P(PMDSS) base material will distort the base material to form a continuous three-dimensional nanoporous structure. Meanwhile, silicon within the P(PMDSS) base material is converted into chemically and structurally stable silicon-oxide-carbon ceramic, thereby forming a bicontinuous three-dimensional nanoporous ceramic layer. Average size of the pores can be controlled by adjusting the ratio of compounds in the solvent or their mole ratio. In general, the size of a pore can range from 200 Å to 620 Å.

The ceramic layer so formed not only has a high degree of internal regularity, but also has a highly complicated three-dimensional nanoporous structure. Porosity and complexity of the structure is difficult to reproduce by a conventional photolithographic process. The interlaced nanoporous structure of the material forming the lower electrode 320 increases the overall surface area, thereby increasing capacitance of the ultimately formed capacitor.

Figure 3D:
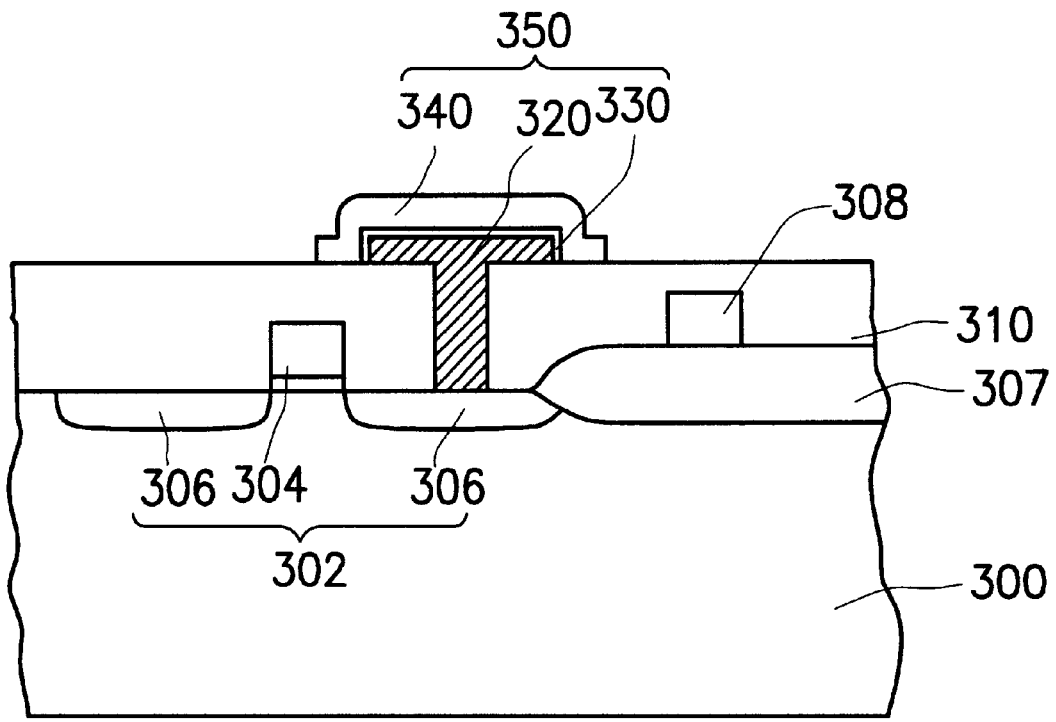

As shown in FIG. 3D, a dielectric layer 330 is formed over the lower electrode layer 320. The dielectric layer 330 can be an oxide/nitride/oxide (ONO) layer, for example. The dielectric layer 330 is formed by conducting a thermal oxidation to grow a silicon oxide layer over the lower electrode layer 320, forming a silicon nitride layer over the oxide layer and conducting another thermal oxidation to form a second silicon oxide layer over the silicon nitride layer. The dielectric layer 330 has a thickness smaller than the lower electrode layer 320, in general, not greater than 300 Å. An upper electrode layer 340 is formed over the dielectric layer 330. The upper electrode layer 340 can be a doped polysilicon layer formed, for example, by chemical vapor deposition. Dopants are added during deposition for increasing electrical conductivity. The upper electrode layer 340 has a thickness between about 1000 Å to 3000 Å. The upper electrode layer 340, the dielectric layer 330 and the lower electrode layer 320 are patterned to form a stacked DRAM capacitor structure 350. Subsequent steps include forming a passivation layer (not shown) over the substrate 300 and forming other DRAM related structures.

This invention also provides a lower electrode structure that uses a bicontinuous three-dimensional nanoporous material. The material not only has a high degree of internal regularity, but also has a high degree of convolution. Moreover, porosity and degree of complexity of the structure is difficult to reproduce by conventional photolithographic means. Since porous material can increase surface area, a lower electrode made from the bicontinuous three-dimensional nanoporous material has a greater overall surface area than an electrode made from conventional material.

In summary, the method of forming a DRAM capacitor according to this invention has the following advantages:

(1) The use of bicontinuous three-dimensional nanoporous material to form the lower electrode increases the overall surface area of the electrode. Hence, charge storage capacity of the ultimately formed capacitor is also increased.

(2) The steps required to form the capacitor structure in this invention are fewer and simpler than the steps for forming a conventional capacitor structure with a complicated cross-sectional profile. Therefore, production time and cost are saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dynamic random access memory (DRAM) capacitor, comprising the steps of:
   providing a semiconductor substrate having a field effect transistor thereon, wherein the field effect transistor includes a source/drain region;
   forming an insulation layer over the semiconductor substrate;
   forming a contact opening in the insulation layer, wherein the contact opening exposes the source/drain region;
   forming a triblock copolymer layer over the semiconductor substrate and inside the contact opening;
   patterning the triblock copolymer layer; annealing the triblock copolymer layer at a low temperature; exposing the triblock copolymer layer to ultraviolet light in an atmosphere containing ozone so that the triblock copolymer transforms into a lower electrode layer having a bicontinuous interlaced three-dimensional nanoporous structure;
   forming a dielectric layer over the lower electrode layer; and
   forming an upper electrode layer over the dielectric layer.

2. The method of claim 1, wherein the insulation layer includes a silicon dioxide layer.

3. The method of claim 1, wherein the triblock copolymer layer is annealed at a temperature between 100° C. to 150° C.

4. The method of claim 1, wherein the triblock copolymer layer is exposed to ultraviolet light and an ozone atmosphere for about an hour.

5. The method of claim 1, wherein a molecule of the triblock copolymer can be represented by the chemical formula $A_1BA_2$, where A represents poly(isoprene) (PI for short) and B represents poly(pentamethyldisilylstyrene) (P(PMDSS) for short), and molecular weight ratio between each group inside the triblock copolymer $A_1BA_2$ is 24/100/26, and the poly(isoprene) roughly occupies 33% by volume.

6. The method of claim 1, wherein the triblock copolymer coating solution contains 4% to 6% by weight of the triblock copolymer material.

7. The method of claim 1, wherein the dielectric layer includes an oxide/nitride/oxide (ONO) composite layer formed by growing a first silicon oxide over the lower electrode layer by thermal oxidation, forming a silicon nitride layer over the first silicon oxide layer and growing a second silicon oxide layer over the silicon nitride layer by thermal oxidation.

8. The method of claim 1, wherein after the step of forming the upper electrode layer, further includes performing photolithographic and etching processes to pattern out a capacitor structure.

9. The method of claim 1, wherein the lower electrode layer has a thickness between about 2000 Å to 5000 Å.

10. The method of claim 1, wherein the step of forming the upper electrode layer includes forming a doped polysilicon layer.

11. The method of claim 1, wherein the upper electrode layer has a thickness between about 1000 Å to 3000 Å.

12. A capacitor structure, comprising:
   a lower electrode, wherein the lower electrode layer is a ceramic material having a bicontinuous interlaced three-dimensional nanoporous structure;
   a dielectric layer; and
   an upper electrode, wherein the upper electrode and the lower electrode are insulated from each other by the dielectric layer.

13. The capacitor structure of claim 12, wherein the steps for forming the ceramic material having a bicontinuous interlaced three-dimensional nanoporous structure include:
   spin-coating a triblock copolymer layer;
   annealing the triblock copolymer layer at a low temperature; and
   exposing the triblock copolymer layer to ultraviolet light in an atmosphere containing ozone so that the triblock copolymer material transforms into a lower electrode layer.

14. The capacitor structure of claim 13, wherein a molecule of the triblock copolymer can be represented by the chemical formula $A_1BA_2$, where A represents poly(isoprene) (PI for short) and B represents poly (pentamethyldisilylstyrene) (P(PMDSS) for short), and molecular weight ratio between each group inside the triblock copolymer $A_1BA_2$ is 24/100/26, and the poly (isoprene) roughly occupies 33% by volume.

15. The capacitor structure of claim 13, wherein the triblock copolymer coating solution contains 4% to 6% by weight of the triblock copolymer material.

16. The capacitor structure of claim 13, wherein the triblock copolymer layer is annealed at a temperature between 100° C. to 150° C.

17. The capacitor structure of claim 13, wherein the triblock copolymer layer is exposed to ultraviolet light and an ozone atmosphere for about an hour.

18. The capacitor structure of claim 13, wherein the lower electrode layer has a thickness between about 2000 Å to 5000 Å.

19. A method of manufacturing a capacitor, comprising the steps of:

forming a copolymer layer having a bicontinuous phase;

patterning the bicontinuous copolymer layer;

removing one of the continuous phase materials inside the bicontinuous copolymer layer so that the bicontinuous copolymer layer transforms into a lower electrode layer having a bicontinuous interlaced three-dimensional nanoporous structure;

forming a dielectric layer over the lower electrode layer; and forming an upper electrode layer over the dielectric layer.

* * * * *